(12) United States Patent
Ueno

(10) Patent No.: US 12,285,904 B2
(45) Date of Patent: Apr. 29, 2025

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Takehiko Ueno, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/947,270

(22) Filed: Sep. 19, 2022

(65) Prior Publication Data

US 2023/0091051 A1 Mar. 23, 2023

(30) Foreign Application Priority Data

Sep. 21, 2021 (JP) ................. 2021-153347

(51) Int. Cl.
*B29C 59/00* (2006.01)
*B29C 37/00* (2006.01)
*B29C 59/02* (2006.01)
*G03F 7/00* (2006.01)

(52) U.S. Cl.
CPC .......... *B29C 59/002* (2013.01); *B29C 59/026* (2013.01); *G03F 7/0002* (2013.01); *B29C 2037/90* (2013.01)

(58) Field of Classification Search
None
See application file for complete search history.

(56) References Cited

U.S. PATENT DOCUMENTS

2006/0193938 A1* 8/2006 Iimura ................... B44B 5/022
425/385
2013/0037981 A1* 2/2013 Tanaka .................. B82Y 40/00
264/40.5

(Continued)

FOREIGN PATENT DOCUMENTS

JP 2007296783 A 11/2007
JP 2017199730 A 11/2017

(Continued)

OTHER PUBLICATIONS

Tamura W. "English Machine Translation of JP-2019165091-A." 2024. Espacenet. EPO. (Year: 2024).*

*Primary Examiner* — Farah Taufiq
*Assistant Examiner* — Jonathan B Woo
(74) *Attorney, Agent, or Firm* — ROSSI, KIMMS & McDOWELL LLP

(57) ABSTRACT

An imprint apparatus that transfers a pattern of a mold to an imprint material on a substrate, includes: a mold having a pattern region in which the pattern is formed; a substrate holding unit having a substrate mounting surface on which the substrate is mounted; a driving unit configured to drive the mold and press the mold against the substrate coated with an imprint material at three or more positions; and a control unit configured to control a pressing force of the driving unit based on a distance in an XY plane parallel to the substrate mounting surface between the driving unit and a top portion of a convex shape of at least one of the mold and the substrate deformed by the deformation mechanism.

6 Claims, 7 Drawing Sheets

(56) References Cited

U.S. PATENT DOCUMENTS

| | | | | |
|---|---|---|---|---|
| 2013/0056904 | A1* | 3/2013 | Hamaya | G03F 7/0002 |
| | | | | 264/293 |
| 2016/0297136 | A1* | 10/2016 | Wakabayashi | B29C 64/00 |
| 2016/0354969 | A1* | 12/2016 | Baba | G03F 7/0002 |
| 2017/0305043 | A1* | 10/2017 | Shiode | G03F 7/0002 |
| 2020/0249569 | A1* | 8/2020 | Hayashi | B29C 43/021 |
| 2022/0355534 | A1* | 11/2022 | Sato | G03F 7/0002 |
| 2023/0066484 | A1* | 3/2023 | Torii | G03F 7/0002 |
| 2023/0321895 | A1* | 10/2023 | Ueno | B29C 59/002 |

FOREIGN PATENT DOCUMENTS

| | | | |
|---|---|---|---|
| JP | 2019165091 A | * | 9/2019 |
| KR | 1020160103020 A | | 8/2016 |
| KR | 1020170121707 A | | 11/2017 |
| KR | 1020210086727 A | | 7/2021 |

* cited by examiner

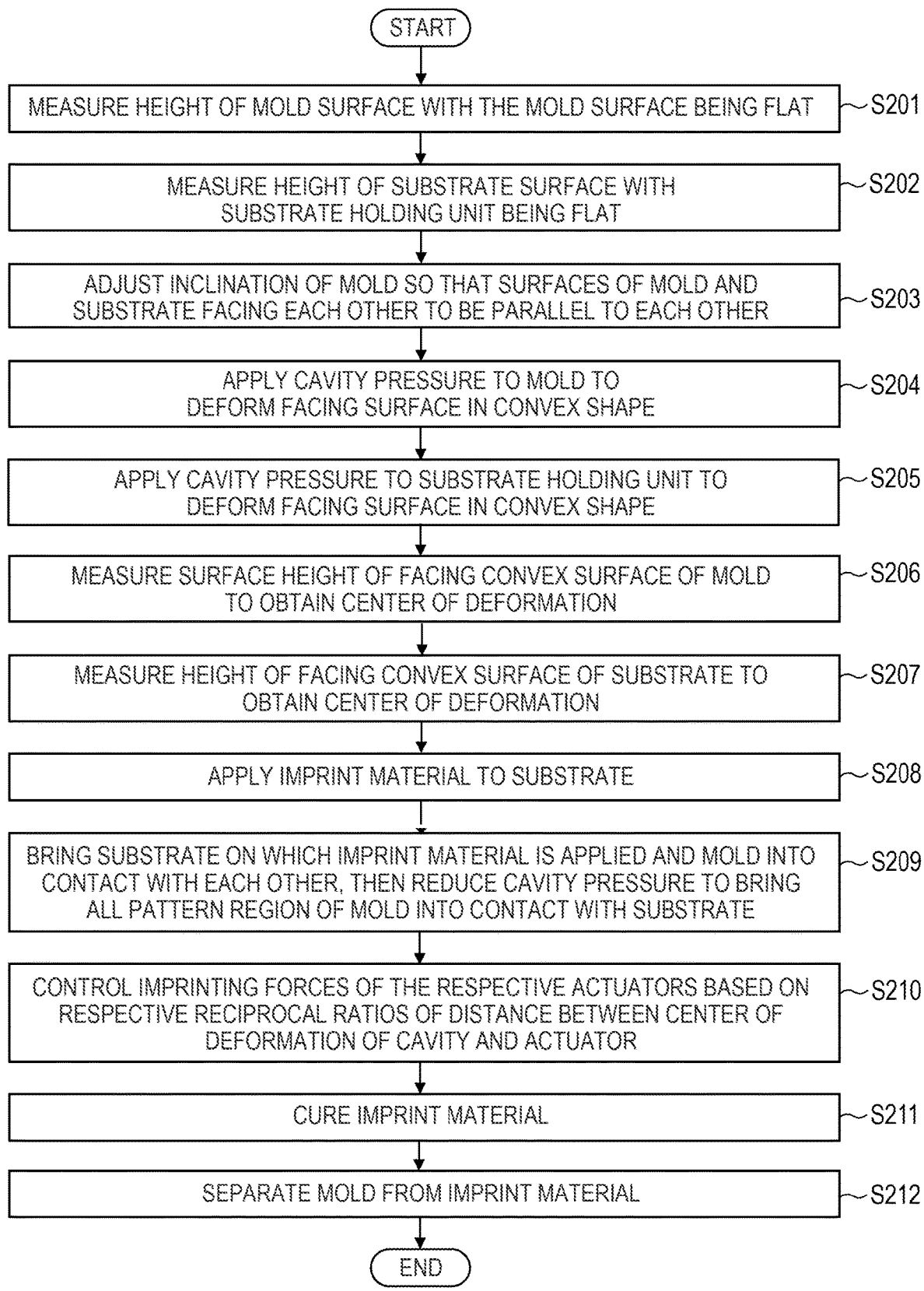

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

As a lithography technique for manufacturing a semiconductor device or the like, an imprint technique of molding an imprint material on a substrate using a mold is known. In the imprint technique, an imprint material on a substrate is cured in a state in which a mold and the imprint material are in contact with each other, and the mold is separated from the cured imprint material, whereby a concave-convex pattern formed of the imprint material can be formed on the substrate.

If bubbles remain in the concave-convex pattern of the mold when the mold and the imprint material on the substrate are brought into contact with each other in the imprint technique, a defect may occur in the concave-convex pattern formed on the imprint material.

Japanese Patent Application Laid-Open No. 2017-199730 discloses a method of bringing a mold and a substrate into contact with each other by deforming at least one of the mold and the substrate into a convex shape in order to reduce remaining air bubbles in the imprint material.

Japanese Patent Application Laid-Open No. 2007-296783 discloses a method of adjusting the amount of application of the imprint material based on the thickness of the residual layer of the imprint material to improve the evenness of the pattern dimensions after etching of the concave-convex pattern formed on the imprint material.

In at least one of the mold and the substrate, a cavity (concave portion) may be formed on the side opposite to the surface having the pattern region so that the thickness of the pattern region and the periphery thereof is reduced in order to facilitate deformation of the pattern region. However, the cavity may be formed such that the center of the cavity is shifted from the center of the pattern region due to, for example, a manufacturing error. As one of methods for adjusting the uniformity of the residual film thickness of the imprint material, there is a method of adjusting the uniformity by an imprint force when the mold and the imprint material on the substrate are brought into contact with each other. However, there is a problem that the residual film thickness when the imprinting force is applied is affected by the deviation of the center of the cavity from the center of the pattern region, and the uniformity of the residual film thickness is lowered.

SUMMARY OF THE INVENTION

The present invention provides an imprint apparatus advantageous in improving the uniformity of the residual film thickness in a pattern region of an imprint material.

According to an aspect of the present invention, an imprint apparatus that transfers a pattern of a mold to an imprint material on a substrate, includes: a mold having a pattern region in which the pattern is formed; a substrate holding unit having a substrate mounting surface on which the substrate is mounted; a driving unit configured to drive the mold and press the mold against the substrate coated with an imprint material at three or more positions; a deformation mechanism configured to deform a surface of at least one of the mold and the substrate facing each other into a convex shape; a mold measurement unit configured to measure a position of the pattern region of the mold in a Z direction perpendicular to the substrate mounting surface; a substrate measurement unit configured to measure a position of the substrate in the Z direction; and a control unit configured to control a pressing force of the driving unit based on a distance in an XY plane parallel to the substrate mounting surface between the driving unit and a top portion of a convex shape of at least one of the mold and the substrate deformed by the deformation mechanism.

According to the present invention, it is possible to provide an imprint apparatus advantageous in improving the uniformity of the residual film thickness in a pattern region of an imprint material.

Further features of the present invention will become apparent from the following description of exemplary embodiments with reference to the attached drawings.

BRIEF DESCRIPTION OF THE DRAWINGS

FIG. 6 is a flowchart in a case where the imprint force is controlled by the distance between the deformation center and the actuator in the second embodiment.

DESCRIPTION OF THE EMBODIMENTS

Figure 1:
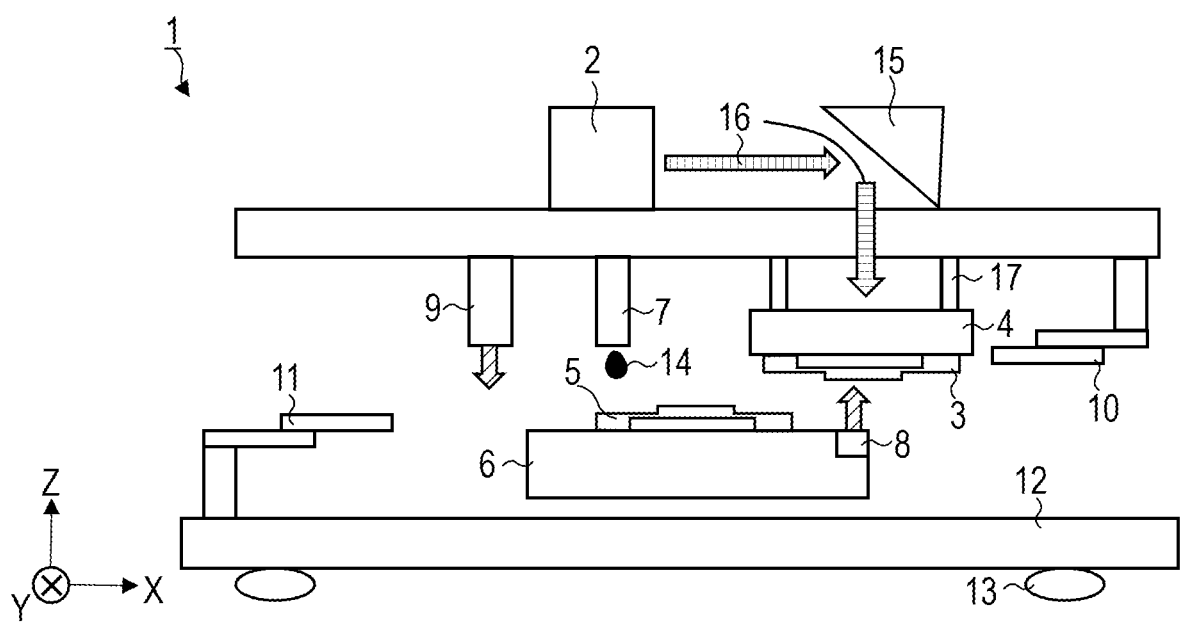
FIG. 1 is a diagram illustrating an imprint apparatus according to a first embodiment.

Hereinafter, preferred embodiments of the present invention will be described in detail with reference to the accompanying drawings. In the drawings, the same members or elements are denoted by the same reference numerals, and overlapping description will be omitted. In addition, it should be noted that the drawings described below may be drawn in a scale different from an actual scale in order to facilitate understanding of the present embodiment.

First Embodiment

FIG. 1 is a view of an imprint apparatus according to the first embodiment.

An imprint apparatus is an apparatus that brings an imprint material supplied onto a substrate into contact with a mold, applies curing energy to the imprint material to cure the imprint material, separates the mold from the imprint material, and forms a concave-convex pattern of the mold on the imprint material.

The imprint apparatus will be described with reference to FIG. 1. Here, assuming that directions perpendicular to each other and parallel to a substrate mounting surface on which the substrate 5 is mounted are an X direction and a Y direction, a plane parallel to the substrate mounting surface is an XY plane, and a direction perpendicular thereto (a height direction of the imprint apparatus 1) is a Z direction, respective axes are determined as shown in FIG. 1.

Here, a description will be given of an imprint apparatus 1 that employs a photo-curing method in which an imprint material is cured by being irradiated with light among imprint techniques.

The light source 2 is an illumination unit that emits light 16 (for example, ultraviolet light) for curing the imprint material 14 during the imprint process. The imprint material is irradiated with the light 16 emitted from the light source 2 after being adjusted by the optical element 15.

The mold 3 is held by a mold holding unit 4 and has a predetermined pattern formed on a surface facing the substrate 5. The mold 3 is usually made of a material capable of transmitting ultraviolet rays, such as quartz, and has a pattern region in which a concave-convex pattern to be transferred to the substrate 5 as a device pattern is formed on a substrate-side surface (pattern surface). In addition, in the mold 3, in order to easily deform the pattern region, a cavity (concave portion) is formed on the opposite side to the pattern surface on which the pattern is formed so that the thickness of the pattern region and the periphery thereof becomes thin. The cavity becomes a substantially sealed space by holding the mold 3 by the mold holding unit 4. The cavity is connected to a pressure adjustment unit that adjusts the pressure of the fluid (gas) in the cavity. A deformation mechanism capable of deforming the pattern surface of the mold 3 into a convex shape is configured by the mold holding unit 4, the mold 3 having a cavity (concave portion), and a pressure adjustment unit that adjusts the pressure in the cavity.

By changing the pressure inside the cavity of the mold 3, the pattern region of the mold 3 is deformed into a convex shape protruding toward the substrate 5. For example, when bringing the mold 3 and the substrate 5 close to each other to bring the mold 3 and the imprint material on the substrate 5 into contact with each other, the pressure adjustment unit increases the pressure inside the cavity to be higher than the pressure outside the cavity, for example, by supplying compressed air to the inside of the cavity. Accordingly, the pressure adjustment unit can deform the pattern region of the mold 3 into a convex shape protruding toward the substrate 5, and can gradually expand the contact region between the mold 3 and the imprint material in the contact processing. As a result, it is possible to reduce bubbles remaining in the concave-convex pattern (concave portion) of the mold 3 in contact with the imprint material, and it is possible to reduce the occurrence of defects in the pattern formed in the imprint material by the imprint process.

The apparatus includes a driving mechanism for moving the mold 3 in the Z direction by an actuator 17 (driving unit) in a state where the mold holding unit 4 holds the mold 3, and a driving mechanism for tilting the mold 3 in accordance with the tilt of the mold 3 and the substrate 5. The mold holding unit 4 may include a driving mechanism that moves the mold holding unit 4 in the XY plane. The mold holding unit 4 has a mechanism for applying pressure to the mold 3 to deform the shape of the mold 3.

The substrate holding unit 6 has a substrate mounting surface for holding the substrate 5 by vacuum suction or electrostatic suction, and is a holding unit movable in the XY plane. The substrate holding unit 6 is driven in the XY plane along the placement surface of the stage surface plate 12 of the imprint apparatus 1. In this case, the reference of the position and inclination in the Z direction when the substrate holding unit 6 is driven in the XY plane is the stage surface plate 12. The stage surface plate 12 is configured on a mount 13, and the imprint apparatus 1 has a structure that is not easily affected by vibration from the floor. In addition, the substrate holding unit 6 may include a driving mechanism that moves the substrate 5 in the Z direction and a rotation mechanism that rotates the substrate 5 around the X axis and the Y axis. The substrate holding unit 6 includes a mechanism that applies pressure to the substrate 5 to deform the shape of the substrate 5, and a mold measurement unit 8.

The mold measurement unit 8 is a distance measurement device capable of measuring the distance in the Z-axis direction between each position on the surface of the mold and the mold measurement unit 8 (the position in the Z-axis direction of each position on the surface of the mold). By moving the substrate holding unit 6 along the XY plane, the mold measurement unit 8 can measure each position (entire surface) in the surface of the mold 3. The mold measurement unit 8 does not need to be mounted on the substrate holding unit 6, and may be provided in a mechanism different from the substrate holding unit 6. Also in this case, each position on the surface of the mold 3 can be measured by moving the mold measurement unit 8 along the XY plane.

The imprint apparatus 1 includes a substrate measurement unit 9 capable of measuring a position in the Z-axis direction at each position on the surface of the substrate 5. The substrate measuring unit 9 is a distance measuring instrument capable of measuring a distance in the Z-axis direction between each position on the surface of the substrate 5 and the substrate measuring unit 9. By moving the substrate holding unit 6 along the XY plane, the substrate measuring unit 9 can measure each position (entire surface) in the surface of the substrate 5. The surface of each position of the substrate 5 may be measured by moving the substrate measurement unit 9 along the XY plane without moving the substrate holding unit 6 along the XY plane.

The imprint material supply unit 7 is a supply unit that supplies the imprint material 14 onto the substrate 5. As the imprint material 14, a curable composition (also referred to as a resin in an uncured state) which is cured by applying energy for curing is used. As the energy for curing, an electromagnetic wave, heat or the like is used. As the electromagnetic waves, for example, light such as infrared rays, visible rays, and ultraviolet rays having wavelengths selected from the range of 10 nm or more and 1 mm or less is used.

The curable composition is a composition that is cured by light irradiation or heating. Among them, the photocurable composition which is cured by light contains at least a polymerizable compound and a photopolymerization initiator, and may contain a non-polymerizable compound or a solvent as necessary. The non-polymerizable compound is at least one selected from the group consisting of a sensitizer, a hydrogen donor, an internal release agent, a surfactant, an antioxidant, a polymer component, and the like.

The imprint material 14 is applied in a film form onto the substrate by a spin coater or a slit coater. Alternatively, the imprint material 14 may be applied onto the substrate 5 in the form of a liquid droplet, or in the form of an island or film formed by connecting a plurality of liquid droplets by a liquid ejecting head. The viscosity (viscosity at 25 degrees Celsius) of the imprint material is, for example, 1 mPa·s or more and 100 mPa·s or less.

As the substrate 5, glass, ceramics, metal, semiconductor, resin, or the like is used, and a member made of a material different from that of the substrate 5 may be formed on the surface thereof as necessary. Specific examples of the substrate 5 include a silicon wafer, a compound semiconductor wafer, and quartz glass.

The mold conveyance device 10 is a conveyance unit that carries the mold 3 into the mold holding unit 4 and carries the mold 3 out of the imprint apparatus 1. The substrate conveyance device 11 is a conveyance unit that carries the substrate 5 into the substrate holding unit 6 and carries the substrate 5 out of the imprint apparatus 1.

In a conventional imprint process, the mold measurement unit 8 measures the position of the surface of the mold 3 in the Z direction at a plurality of points in a pattern transfer region. Further, the substrate measuring unit 9 measures the position of the surface of the substrate 5 in the Z direction at a plurality of points in the pattern transfer region. Thereafter, the tilt of the mold 3 is adjusted by the actuator 17 so that the mold 3 and the substrate 5 are relatively parallel to each other. Next, the imprint material 14 is applied to the substrate 5 from the imprint material supply unit 7. Thereafter, the pressure in the cavity of the mold 3 (cavity pressure) is increased to deform the surface of the mold 3 on which the concave-convex pattern is formed into a convex shape. In this state, the mold 3 and the imprint material 14 on the substrate 5 are brought into contact with each other, and imprint is performed by bringing the entire surface of the pattern region and the imprint material into contact with each other while restoring the shape of the concave-convex pattern forming surface of the mold 3 from the convex shape thereof by reducing the cavity pressure. Further, when the mold 3 and the imprint material 14 are brought into contact with each other, the actuator 17 can apply an imprint force to adjust the uniformity of the residual film thickness of the imprint material 14.

Figure 2:
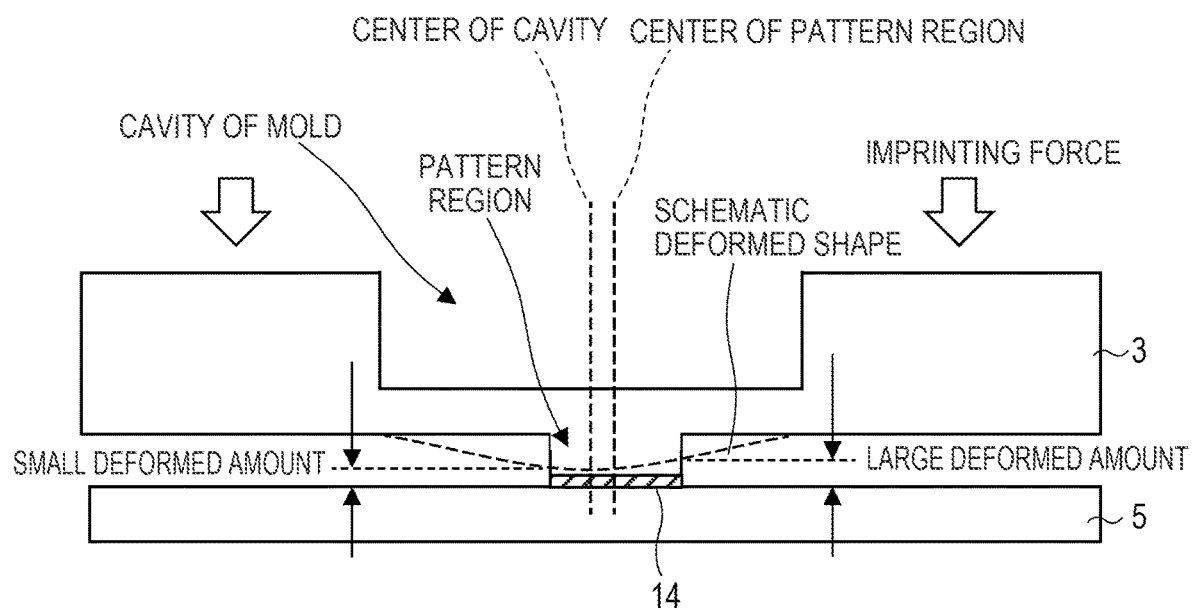
FIG. 2 is a schematic diagram of deformation of a mold due to an imprint force in the first embodiment.

However, as shown in FIG. 2, when the center of the cavity is formed to be deviated from the center of the pattern region due to a manufacturing error of the cavity of the mold 3 or the like, the deformation center (Om) of the mold 3 may be formed to be deviated from the center of the pattern region. Due to this, the uniformity of the residual film thickness of the imprint material in the case where the imprint force is applied at the pressing positions P1, P2 and P3 may decrease. The actuator 17 that applies an imprint force presses the mold 3 in a direction (Z direction) toward the substrate 5 at three or more positions (pressing positions).

A method for improving the uniformity of the residual film thickness by reducing the influence of the deviation between the center of the cavity and the center of the pattern region on the residual film thickness when the uniformity of the residual film thickness of the imprint material is adjusted by the imprint force applied at three positions will be described.

In the imprint process, the mold measurement unit 8 measures the position of the surface of the mold 3 in the Z direction at a plurality of points in the pattern region in a state where the mold 3 is flat (a state where no cavity pressure is applied). Further, the substrate measurement unit 9 measures the position of the surface of the substrate 5 in the Z direction at a plurality of points in the pattern transfer region, and the actuator 17 adjusts the inclination of the mold 3 so that the mold 3 and the substrate 5 are relatively parallel to each other. Here, the tilt adjustment is performed by moving the mold 3 using the actuator 17. However, the present invention is not limited thereto, and the degree of parallel may be adjusted by moving the substrate holding unit 6.

Subsequently, a cavity pressure is applied to the mold 3 to deform the surface of the pattern region of the mold 3 into a convex shape towards the substrate 5. In this state, the mold measurement unit 8 measures the position of the surface of the mold 3 in the Z direction at a plurality of points in the pattern region, and obtains the coordinates of the deformation center of the mold 3. Here, the deformation center is a position at which the position in the Z direction at each position on the surface (XY plane) of the mold 3 on the substrate 5 side is closest to the substrate (the Z position is smallest), and the coordinates of the deformation center are the XY coordinates of the position.

Next, the imprint material 14 supplied from the imprint material supply unit 7 is applied to the substrate 5. Thereafter, the mold 3 and the imprint material 14 on the substrate 5 are brought into contact with each other in a state in which the mold 3 is deformed into a convex shape by applying a cavity pressure thereto, and then the imprint is performed by bringing the entire surface of the pattern region and the imprint material into contact with each other while decreasing the cavity pressure.

The imprint force when the mold 3 and the imprint material 14 are brought into contact with each other is set as follows. The distribution ratio of the pressing force of each actuator 17 is set so that the sum of the product of the vector in the XY plane from the deformation center of the mold 3 to the position of each actuator 17 and the distribution ratio of the pressing force of the actuator 17 becomes 0. Here, the deformation center of the mold 3 is the position of the top portion of the convex shape. For example, when the imprint force is applied by the actuators 17 arranged at three positions, the distribution ratio Rn of the pressing force of each actuator 17 is determined so as to satisfy the following equations, $$\sum_{n=1}^{3} Vn \cdot Rn = 0 \quad (1)$$

$$\sum_{n=1}^{3} Rn = 1 \quad (2)$$

where Vn (=(Xn, Yn)) represents a vector in the XY plane from the deformation center of the mold 3 to the position of the n-th actuator 17, and Rn (n=1, 2, 3) represents a distribution ratio of the pressing force of the n-th actuator. The expression (1) can be expressed in a resolved form into X component and Y component as follows, respectively.

$$\sum_{n=1}^{3} Xn \cdot Rn = 0 \quad (3)$$

$$\sum_{n=1}^{3} Y_n \cdot Rn = 0 \quad (4)$$

In this way, the distribution ratio of the pressing force of each actuator 17 is set based on the relationship between the deformation center of the mold 3 and the position of each actuator 17. As a result, the influence of the deviation between the center of deformation of the mold 3 and the center of the pattern region on the residual film thickness can be reduced, and the uniformity of the residual film thickness can be improved.

Here, in a case where the angle between the three line segments connecting the three actuators 17 and the deformation center of the mold 3 can be approximated to 120 degrees, the distribution ratio can be easily obtained as follows. The distribution ratio Rn (n=1, 2, 3) of the pressing force of the n-th actuator 17 is preferably set as follow, $$Rn = \frac{\frac{1}{Ln}}{\frac{1}{L1} + \frac{1}{L2} + \frac{1}{L3}} \quad (5)$$

where Ln (n=1, 2, 3) represents the distances between the deformation center of the mold 3 and the positions of the three actuators 17 in a plane parallel to the substrate mounting surface. In this way, the pressing force of each actuator 17 is controlled based on (the reciprocal ratio of) the distance from the deformation center of the mold 3 to the position of each actuator 17. As a result, it is possible to reduce the influence of the deviation between the center of the cavity of the mold 3 and the center of the pattern region on the residual film thickness and improve the uniformity of the residual film thickness.

Note that the case where the angle between three line segments connecting the three actuators 17 and the deformation center of the mold 3 can be approximated to 120 degrees refers to a case where the angle is in the range of 110 to 130 degrees. Further, this angle range is preferably 115 to 125 degrees, more preferably 118 to 122 degrees, and even more preferably 119 to 121 degrees.

Embodiment 1

Figure 3:
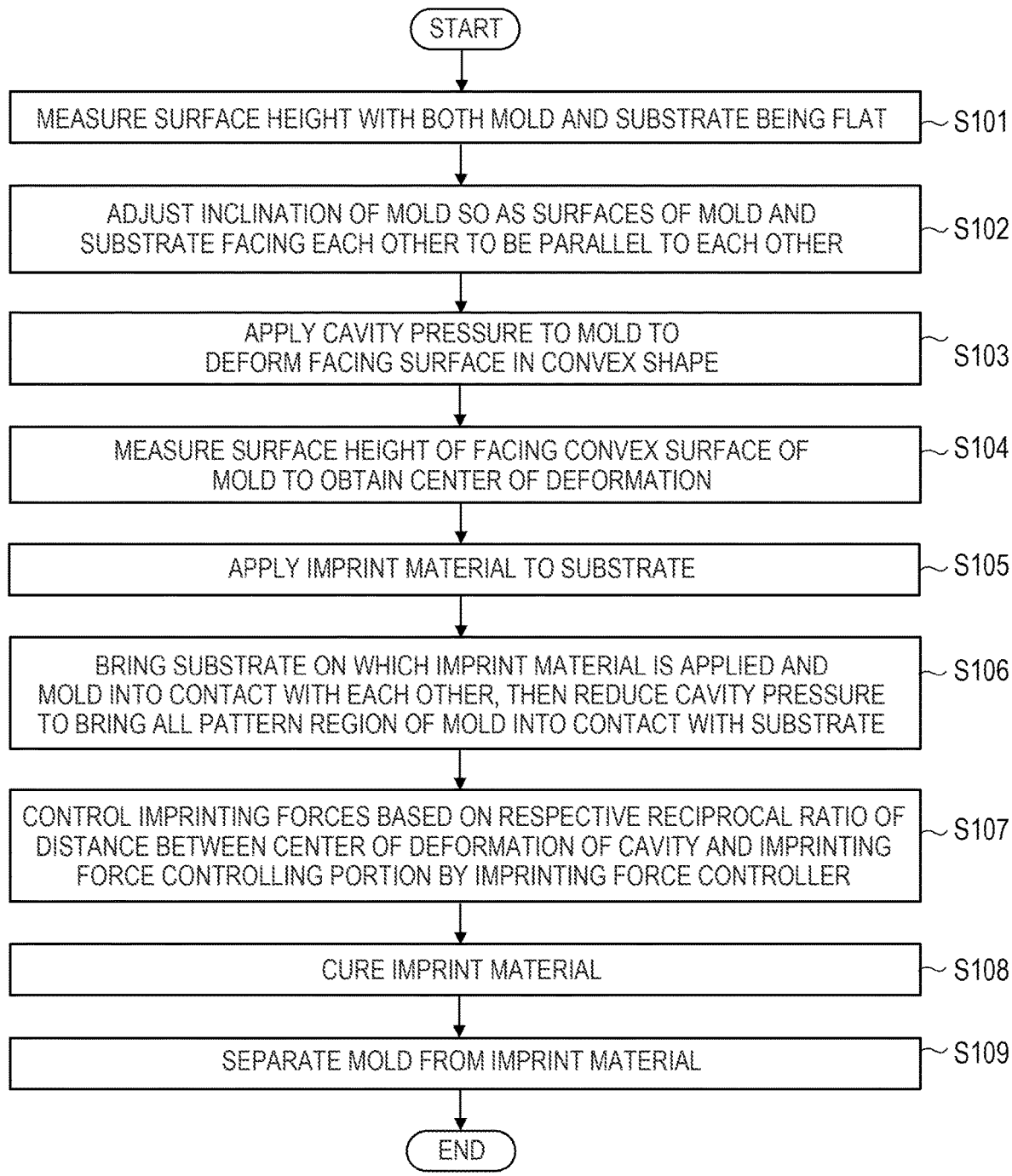
FIG. 3 is a flowchart in the case where the imprint force is controlled by the distance between the deformation center and the actuator in the first embodiment.

An imprint method using the imprint apparatus of the first example according to the first embodiment will be described with reference to FIG. 3. The imprint method of the present invention is executed by being controlled by a control apparatus (control unit) (not shown) in accordance with the processing flow shown in the flowchart of FIG. 3. Here, the imprint apparatus of the first embodiment is configured such that the center of the cavity of the mold 3 is positioned in a triangle formed by the three actuators 17 in the XY plane.

First, in a S101, the position of the mold 3 in the Z direction is measured at a plurality of points in the pattern region by the mold measurement unit 8 while moving the mold holding unit 4 or the substrate holding unit 6 in the XY plane in a state where the pattern surface of the mold 3 is flat (a state where the inside of the cavity is not pressurized). Further, the position of the substrate 5 in the Z direction is measured at a plurality of points in the pattern transfer region by the substrate measuring unit 9.

In the S102, the tilt of the mold 3 is adjusted by the actuators 17 so that the tilts of the surfaces of the mold 3 and the substrate 5 facing each other are relatively parallel to each other.

In step S103, cavity pressure is applied to the mold 3 to deform the pattern surface facing the substrate 5 into a convex shape.

In S104, in a state where the pattern surface of the mold 3 is deformed into a convex shape, the mold measurement unit 8 measures the distance between the mold measurement unit 8 and the mold 3 (the position in the Z direction of the surface of the mold 3 facing the substrate 5) at a plurality of points in the pattern region, and acquires the coordinates of the deformation center (top) of the mold 3.

In S105, the imprint material 14 supplied from the imprint material supplying unit 7 is applied to the substrate 5.

In S106, the mold 3 and the imprint material 14 on the substrate 5 are brought into contact with each other in a state where the mold 3 is deformed into a convex shape, and the entire surface of the pattern region and the imprint material is brought into contact with each other while the cavity pressure is reduced.

Figure 4:
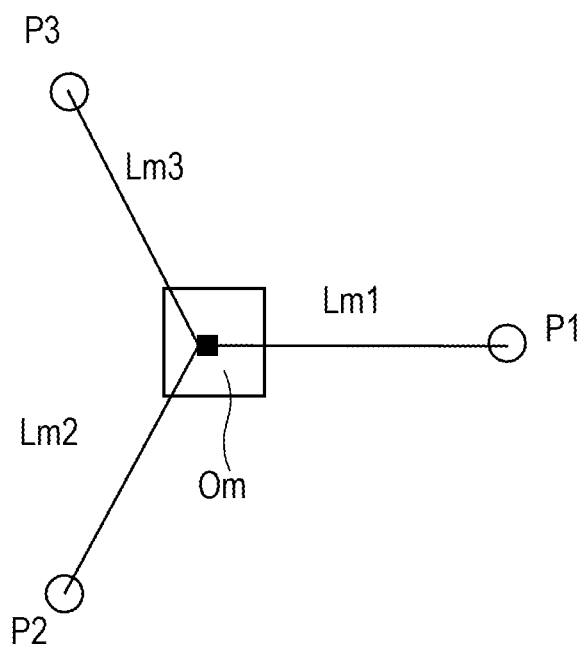
FIG. 4 is an explanatory diagram of each parameter of Expressions (6), (7) and (8).

Next, in S107, each of the three actuators 17 is controlled by an imprint force based on a reciprocal ratio of the respective distances between the deformation center of the mold and the respective actuators, the imprint force with which the mold 3 and the imprint material 14 are brought into contact and pressed against each other. The imprint forces of the three actuators denoted by F1, F2, and F3 are expressed as follows, respectively, $$F1 = F \cdot \frac{\frac{1}{Lm1}}{\frac{1}{Lm1} + \frac{1}{Lm2} + \frac{1}{Lm3}} \quad (6)$$

$$F2 = F \cdot \frac{\frac{1}{Lm2}}{\frac{1}{Lm1} + \frac{1}{Lm2} + \frac{1}{Lm3}} \quad (7)$$

$$F3 = F \cdot \frac{\frac{1}{Lm3}}{\frac{1}{Lm1} + \frac{1}{Lm2} + \frac{1}{Lm3}} \quad (8)$$

$$F1 + F2 + F3 = F \quad (9)$$

where Lm1, Lm2 and Lm3 in Expressions (6), (7), and (8) represent distances in a plane parallel to the substrate mounting surface between the deformation center of the mold 3 and the pressing positions of the three actuators as shown FIG. 4, and F represents the total value of the imprint forces of the three actuators 17.

Next, in S108, the imprint material 14 is irradiated with light 16 (for example, ultraviolet rays) from the light sources 2 to be cured.

Thereafter, in S109, the mold 3 is separated from the imprint material 14, and the concave-convex pattern of the mold is formed on the imprint material 14.

In this manner, by controlling the distribution ratio of the pressing force based on (the reciprocal ratio of) the distance from the deformation center of the mold 3 to the position of each actuator 17, it is possible to reduce the influence of the deviation between the deformation center of the mold 3 and the center of the pattern region on the residual film thickness and improve the uniformity of the residual film thickness.

In the present embodiment, the mold 3 and the imprint material 14 on the substrate 5 are brought into contact with each other in a state where the mold 3 is deformed into a convex shape by applying the cavity pressure to the mold 3, but the present invention is not limited thereto. Instead of the mold 3, the substrate 5 may have a mechanism that deforms the surface on the mold 3 side into a convex shape, and the imprint material 14 on the substrate 5 whose surface on the side facing the mold 3 has been deformed into a convex shape may be brought into contact with the mold 3. In other words, one of the mold 3 and the substrate 5 may have a mechanism for deforming the facing surface into a convex shape.

In the first embodiment, the center of the cavity of the mold 3 is positioned in a triangle formed by the three actuators 17 in the XY plane, and three line segments connecting the three actuators 17 and the deformation center of the mold 3 are at an angle in the range of 110 to 130 degrees. When the angle is preferably from 115 to 125 degrees, more preferably from 118 to 122 degrees, and even more preferably from 119 to 121 degrees, the effects of the present invention can be more suitably obtained.

Second Embodiment

A second embodiment of the present invention will be described with reference to FIG. 1, in which imprinting is performed by applying cavity pressure to both the mold 3 and the substrate 5 to deform them.

The second embodiment is different from the first embodiment in that not only the mold 3 but also the substrate 5 has a mechanism for deforming the surface on the mold 3 side into a convex shape. That is, the pressure adjustment unit (not illustrated) also adjusts the pressure of a fluid (gas) in a substantially sealed space (cavity (concave portion)) formed between the substrate holding unit 6 and the substrate 5 sucked to the substrate holding unit 6 so as to deform the surface of the substrate 5 on the mold 3 side into a convex shape. The mold holding unit 4, the mold 3, the substrate holding unit 6, and a pressure adjustment unit that adjusts the pressure in the cavity constitute a deformation mechanism that deforms the pattern surface of the mold 3 and the substrate 5 into convex shapes.

In a conventional imprint process, the mold measurement unit 8 measures the position of the surface of the mold 3 in the Z direction at a plurality of points in a pattern transfer region. Further, the substrate measuring unit 9 measures the position of the surface of the substrate 5 in the Z direction at a plurality of points in the pattern transfer region. Thereafter, the tilt of the mold 3 is adjusted by the actuator 17 so that the mold 3 and the substrate 5 are relatively parallel to each other. Next, the imprint material 14 is applied to the substrate 5 from the imprint material supply unit 7. Thereafter, cavity pressure is applied to both the mold 3 and the substrate 5 to bring the mold 3 and the imprint material 14 on the substrate 5 into contact with each other in a state where the mold 3 and the substrate 5 are deformed into a convex shape, and imprint is performed by bringing the entire surface of the pattern region and the imprint material into contact with each other while reducing the cavity pressure. Further, when the mold 3 and the imprint material 14 are brought into contact with each other, it is possible to adjust the uniformity of the residual film thickness of the imprint material 14 by applying an imprint force using the three actuators 17.

Figure 5:
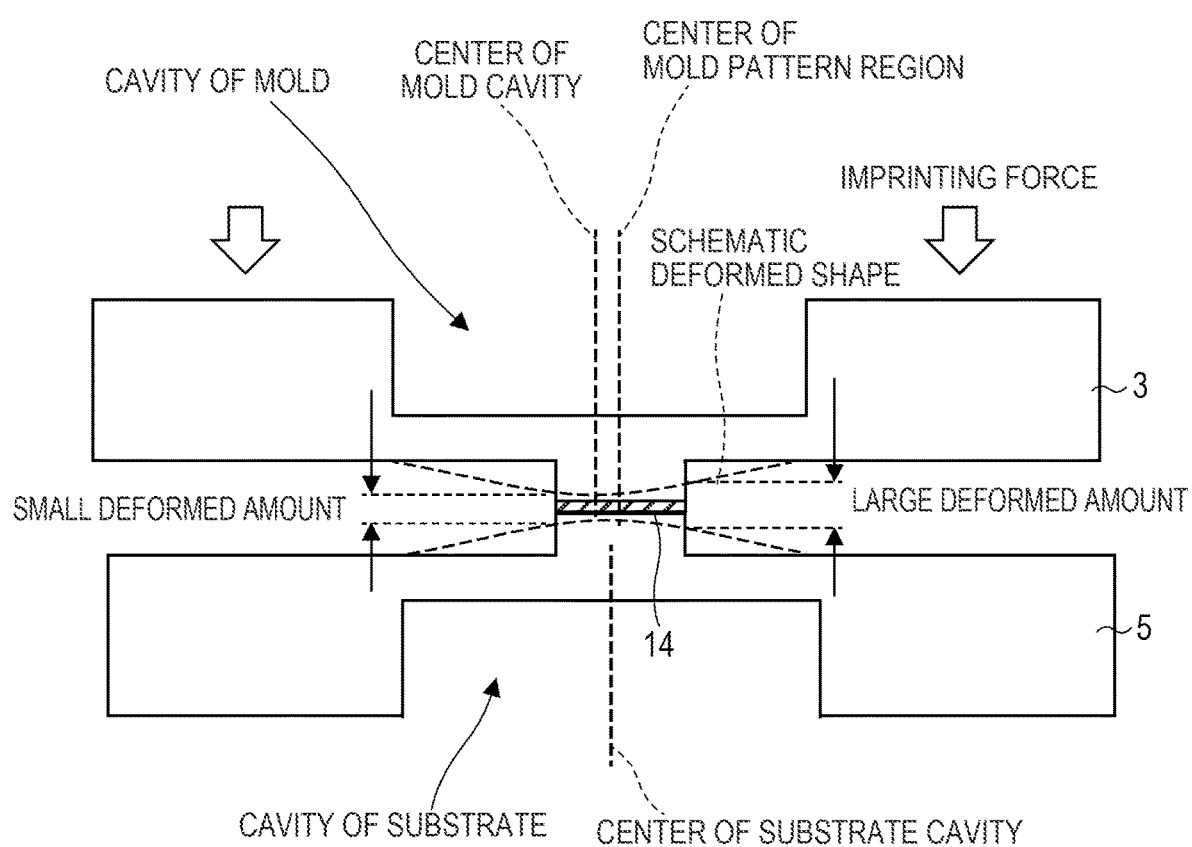
FIG. 5 is a schematic diagram of deformation of a mold and a substrate due to an imprint force in the second embodiment.

However, as shown in FIG. 5, when the center of the cavity is formed to be deviated from the center of the pattern region due to a manufacturing error of the cavity or the like, the deformation center (Om) of the mold 3 and the deformation center (Os) of the substrate 5 may be formed to be deviated from the center of the pattern region. Due to this, the uniformity of the residual film thickness of the imprint material 14 in a case where the imprint force is applied may be degraded. The actuator 17 that applies an imprint force presses the mold 3 in the direction of the substrate 5 (Z direction) at least three positions.

A method of improving the uniformity of the residual film thickness by reducing the influence of the deviation between the cavity center and the pattern region center on the residual film thickness when the uniformity of the residual film thickness of the imprint material 14 is adjusted by the imprint force applied at three positions will be described.

In the imprint process, the mold measurement unit 8 measures the position of the surface of the mold 3 in the Z direction at a plurality of points in the pattern region in a state where the mold 3 is flat (a state where a cavity pressure is not applied to the mold 3). Further, in a state where the substrate 5 is flattened (a state where the cavity pressure is not applied to the substrate holding unit 6), the position of the surface of the substrate 5 in the Z direction is measured at a plurality of points in the pattern transfer region by the substrate measuring unit 9. The inclination of the mold 3 is adjusted by the actuator 17 so that the tilts of the mold 3 and the substrate 5 are relatively parallel to each other. Although the inclination is adjusted by moving the mold 3 with the actuator 17 in this embodiment, the present invention is not limited to this, and the degree of parallel may be adjusted by moving the substrate holder 6.

Subsequently, a cavity pressure is applied to the mold 3 to deform the surface of the pattern region of the mold 3 into a convex shape with respect to the substrate 5. In this state, the mold measurement unit 8 measures the distance from the mold 3 (the position of the surface of the mold 3 in the Z direction) at a plurality of points in the pattern region, and obtains the coordinates of the deformation center of the mold 3. Here, the deformation center is the position of the XY coordinates where the position in the Z direction of the surface (XY plane) of the mold 3 on the substrate 5 side is closest to the substrate (the Z position is smallest).

Furthermore, in a state where the cavity pressure is also applied to the substrate 5 side to deform the surface of the substrate 5 on the mold 3 side into a convex shape, the substrate measurement unit 9 measures the distance from the substrate 5 (the position of the surface of the substrate 5 in the Z direction) at a plurality of points in the pattern transfer region, and obtains the coordinates of the deformation center of the substrate 5. Here, the deformation center is the position of the XY coordinates at which the position in the Z direction of the surface (XY plane) of the substrate 5 on the mold 3 side is closest to the mold 3 side (the Z position is largest).

Next, the imprint material 14 is applied to the substrate 5 from the imprint material supply unit 7. Thereafter, the mold 3 and the imprint material 14 on the substrate 5 are brought into contact with each other in a state where both the mold 3 and the substrate 5 are deformed into a convex shape by applying a cavity pressure thereto, and then the entire surface of the pattern region and the imprint material is brought into contact with each other while reducing the cavity pressure of the mold 3 and the substrate 5 to perform imprinting.

The imprint force when the mold 3 and the imprint material 14 are brought into contact with each other is set as follows.

The first distribution ratio of the pressing force of each actuator 17 is set so that the sum of the product of the vector in the XY plane from the deformation center of the mold 3 to the position of each actuator 17 and the first distribution ratio of the pressing force of the actuator 17 becomes 0. For example, when the imprint force is applied by the actuators 17 arranged at three positions, the first distribution ratio Rmn of the pressing force of each actuator 17 is determined so as to satisfy the following equations, $$\sum_{n=1}^{3} Vmn \cdot Rmn = 0 \qquad (10)$$

$$\sum_{n=1}^{3} Rmn = 0.5 \qquad (11)$$

where $Vmn (=(Xmn, Ymn))(n=1, 2, 3)$ represents a vector in the XY plane from the deformation center of the mold 3 to the position of the n-th actuator 17, and $Rmn$ $(n=1, 2, 3)$ represents a first distribution ratio of the pressing force of the n-th actuator. The expression (10) can be expressed in a resolved form into X component and Y component as follows, respectively.

$$\sum_{n=1}^{3} Xmn \cdot Rmn = 0 \quad (12)$$

$$\sum_{n=1}^{3} Ymn \cdot Rmn = 0 \quad (13)$$

Similarly, the second distribution ratio of the pressing force of each actuator 17 is set so that the sum of the products of the vector in the XY plane from the deformation center of the substrate 5 to the position of each actuator 17 and the second distribution ratio of the pressing force of the actuator 17 becomes 0. When the imprint force is applied by three actuators 17, the second distribution ratio $Rsn$ of the pressing force of each actuator 17 is determined so as to satisfy the following equations, $$\sum_{n=1}^{3} Vsn \cdot Rsn = 0 \quad (14)$$

$$\sum_{n=1}^{3} Rsn = 0.5 \quad (15)$$

where $Vsn (=(Xsn, Ysn))$ $(n=1, 2, 3)$ represents a vector in the XY plane from the deformation center of the substrate 5 to the position of the n-th actuator 17, and $Rsn$ $(n=1, 2, 3)$ represents a second distribution ratio of the pressing force of the n-th actuator. The expression (14) can be expressed in a resolved form into X component and Y component as follows, respectively.

$$\sum_{n=1}^{3} Xsn \cdot Rsn = 0 \quad (16)$$

$$\sum_{n=1}^{3} Ysn \cdot Rsn = 0 \quad (17)$$

As described above, the imprint force F applied by the three actuators 17 is controlled so as to be distributed to the n-th actuators 17 $(n=1, 2, 3)$ at a distribution ratio $Rn=Rmn+Rsn$.

In this manner, the distribution ratio of the pressing force of each actuator 17 is set based on the relationship between the deformation center of the mold 3 and the position of each actuator 17 and the relationship between the deformation center of the substrate 5 and the position of each actuator 17. Accordingly, it is possible to reduce the influence of the deviation between the center of the cavity of the mold 3 and the center of the pattern region on the residual film thickness, and to improve the uniformity of the residual film thickness.

Here, in a case where the angle between three line segments connecting the three actuators 17 and the deformation center of the mold 3 and the angle between three line segments connecting the three actuators 17 and the deformation center of the substrate 5 can be approximated to 120 degrees, the distribution ratio can be easily obtained as follows. When the distances between the deformation center of the mold 3 and the positions of the three actuators 17 are $Lmn$ $(n=1, 2, 3)$ and the distances between the deformation center of the substrate 5 and the pressing positions of the three actuators 17 in a plane parallel to the substrate mounting surface are $Lsn$ $(n=1, 2, 3)$, the distribution ratio $Rn$ $(n=1, 2, 3)$ of the pressing force of the n-th actuator 17 is preferably set as follows.

$$Rn = \left( \frac{\frac{1}{Lmn}}{\frac{1}{Lm1}+\frac{1}{Lm2}+\frac{1}{Lm3}} + \frac{\frac{1}{Lsn}}{\frac{1}{Ls1}+\frac{1}{Ls2}+\frac{1}{Ls3}} \right)/2 \quad (18)$$

In this way, the pressing force of each actuator 17 is controlled based on (the reciprocal ratio of) the distance between the deformation centers of the mold 3 and the substrate 5 and the actuator. As a result, it is possible to reduce the influence of the deviation between the centers of the cavities of the mold 3 and the substrate 5 and the center of the pattern region on the residual film thickness to improve the uniformity of the residual film thickness.

Note that the case where the angles between three line segments connecting the three actuators 17 and the deformation centers of the mold 3 and the substrate 5 can be approximated to 120 degrees refers to a case where the angle is within an angle range of 110 to 130 degrees. Further, this angle range is preferably 115 to 125 degrees, more preferably 118 to 122 degrees, and even more preferably 119 to 121 degrees.

Embodiment 2

Figure 7A:
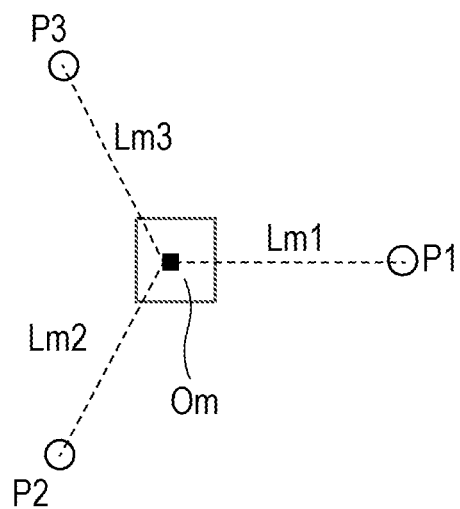
FIG. 7A is an explanatory diagram of each parameter of Expression (18).
Figure 7B:
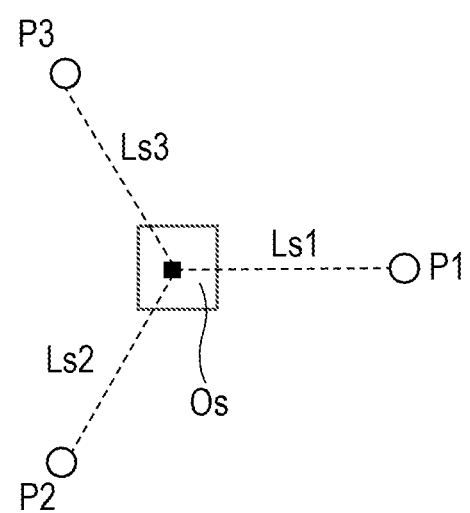
FIG. 7B is an explanatory diagram of each parameter of Expression (18).

An imprint method using an imprint apparatus according to the second embodiment will be described with reference to FIGS. 6 and 7. The imprint method of the present invention is executed by being controlled by a control apparatus (control unit) (not shown) in accordance with the processing flow shown in the flowchart of FIG. 6. Here, the imprint apparatus according to the second embodiment is configured such that the center of the cavity of the mold 3 and the center of the cavity of the substrate 5 are positioned in a triangle formed by the three actuators 17 in the XY plane.

First, in S201, the position of the mold 3 in the Z direction is measured at a plurality of points in the pattern region by the mold measurement unit 8 while moving the mold holding unit 4 or the substrate holding unit 6 in the XY plane in a state where the pattern surface of the mold 3 is flat (a state where the inside of the cavity is not pressurized).

In S202, the distance between the substrate measurement unit 9 and the substrate 5 (the position of the substrate 5 in the Z direction) is measured at a plurality of points in the pattern transfer region by the substrate measurement unit 9 in a state where the substrate 5 is flat (a state where the inside of the cavity is not pressurized).

In S203, the tilt of the mold 3 is adjusted by the actuators 17 so that the tilts of the surfaces of the mold 3 and the substrate 5 facing each other are relatively parallel to each other.

In S204, cavity pressure is applied to the mold 3 to deform the pattern surface facing the substrate 5 into a convex shape.

In S205, cavity pressure is also applied to the substrate 5 side to deform the surface of the substrate 5 facing the mold 3 into a convex shape.

In S206, in a state where the surface of the mold 3 facing the substrate 5 is deformed into a convex shape, the mold measurement unit 8 measures the distance between the mold measurement unit 8 and the mold 3 (the position of the mold 3 in the Z direction) at a plurality of points in the pattern region to acquire the coordinates of the deformation center (apex) of the mold.

In S207, in a state where the surface of the substrate 5 facing the mold 3 is deformed into a convex shape, the substrate measurement unit 9 measures the distance between the substrate measurement unit 9 and the substrate 5 (the position of the surface of the substrate 5 in the Z direction) at a plurality of points in the pattern transfer region, and obtains the coordinates of the deformation center of the substrate 5.

In S208, the imprint material 14 is applied to the substrate 5 from the imprint material supplying unit 7.

In S209, the mold 3 and the imprint material 14 on the substrate 5 are brought into contact with each other in a state where both the mold 3 and the substrate 5 are deformed into a convex shape by applying a cavity pressure, and then the entire surface of the pattern region and the imprint material is brought into contact with each other while reducing the cavity pressure in both the mold 3 and the substrate 5.

In S210, each of the three actuators 17 is controlled by an imprint force based on a reciprocal ratio of distances between the respective deformation centers of the mold 3 and the substrate 5 and the respective actuators 17 as an imprint force when the mold 3 and the imprint material 14 are brought into contact with each other. Lm1, Lm2, Lm3, Ls1, Ls2, Ls3 in Expressions (19), (20), and (21) are distances between the deformation centers of the mold 3 (FIG. 7A) and the substrate 5 (FIG. 7B) and the pressing positions of the actuators 17 in the XY plane parallel to the substrate mounting surface. The total value of the imprint forces of the three actuators 17 is denoted by F, and the imprint forces of the respective actuators 17 are denoted by (F1, F2, F3).

$$F3 = F \cdot \left( \frac{\frac{1}{Lm3}}{\frac{1}{Lm1} + \frac{1}{Lm2} + \frac{1}{Lm3}} + \frac{\frac{1}{Ls3}}{\frac{1}{Ls1} + \frac{1}{Ls2} + \frac{1}{Ls3}} \right)/2 \quad (21)$$

$$F1 = F \cdot \left( \frac{\frac{1}{Lm1}}{\frac{1}{Lm1} + \frac{1}{Lm2} + \frac{1}{Lm3}} + \frac{\frac{1}{Ls1}}{\frac{1}{Ls1} + \frac{1}{Ls2} + \frac{1}{Ls3}} \right)/2 \quad (19)$$

$$F2 = F \cdot \left( \frac{\frac{1}{Lm2}}{\frac{1}{Lm1} + \frac{1}{Lm2} + \frac{1}{Lm3}} + \frac{\frac{1}{Ls2}}{\frac{1}{Ls1} + \frac{1}{Ls2} + \frac{1}{Ls3}} \right)/2 \quad (20)$$

$$F1 + F2 + F3 = F \quad (22)$$

Next, in S211, the imprint material 14 is irradiated with light 16 (for example, ultraviolet rays) from the light sources 2 to be cured.

Thereafter, in S212, the mold 3 is separated from the imprint material 14, and the concave-convex pattern of the mold is formed on the imprint material 14.

In this manner, the distribution ratio of the pressing force of each actuator 17 is set and controlled based on the reciprocal ratio of the distance from the deformation center of the mold 3 to the position of each actuator 17 and the reciprocal ratio of the distance from the deformation center of the substrate 5 to the position of each actuator 17. Accordingly, it is possible to reduce the influence of the deviation between the center of the cavity of the mold 3 and the center of the pattern region on the residual film thickness, and to improve the uniformity of the residual film thickness.

The imprint apparatus according to the second embodiment is configured such that the centers of the cavities of the mold 3 and the substrate 5 are located in a triangle formed by the three actuators 17 in the XY plane. Three line segments connecting the three actuators 17 and the deformation center of the mold 3 form an angle in a range of 110 to 130 degrees with each other, and three line segments connecting the three actuators 17 and the deformation center of the substrate 5 form an angle in a range of 110 to 130 degrees with each other. When the angle range of 110 to 130 degrees is preferably 115 to 125 degrees, more preferably 118 to 122 degrees, and even more preferably 119 to 121 degrees, the effects of the present invention can be more suitably obtained.

Embodiment of Method for Producing Article

The method of manufacturing an article according to an embodiment of the present invention is suitable for manufacturing an article such as a microdevice such as a semiconductor device or an element having a microstructure. The pattern of the cured product molded using the imprint apparatus is used permanently in at least a part of various articles or temporarily when various articles are manufactured.

The article is an electric circuit element, an optical element, MEMS, a recording element, a sensor, a mold, or the like. Examples of the electric circuit elements include volatile or nonvolatile semi-conductor memories such as DRAM, SRAM, flash memory, and MRAM, and semiconductor elements such as LSI, CCD, image sensor, and FPGA. Examples of the mold include a mold for imprinting. The pattern of the cured product is used as it is as a constituent member of at least a part of the article, or temporarily used as a resist mask. After etching, ion implantation, or the like is performed in substrate processing steps, the resist mask is removed.

The method of manufacturing an article according to this embodiment includes a step of forming a pattern on a resin applied to a substrate using the above-described imprint apparatus (a step of performing an imprint process on the substrate), and a step of processing the substrate on which the pattern has been formed in the preceding step. Furthermore, the manufacturing method includes other well-known steps (oxidation, film formation, vapor deposition, doping, planarization, etching, resist removal, dicing, bonding, packaging, and the like). The method for manufacturing an article according to the present embodiment is advantageous in at least one of performance, quality, productivity, and production cost of the article as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-153347, filed Sep. 21, 2021, which is hereby incorporated by reference herein in its entirety.

What is claimed is:

1. An imprint apparatus that transfers a pattern of a mold to an imprint material on a substrate, comprising:
   the mold having a first surface including a pattern region in which the pattern is formed and a second surface, opposite the first surface, in which a cavity is formed;
   a substrate holding unit having a substrate mounting surface on which the substrate is mounted;
   a driving unit configured to drive the mold and press the mold against the substrate coated with the imprint material at three or more positions based on a center of the pattern region in the mold;
   a deformation mechanism configured to deform the first surface of the mold into a convex shape when the mold and the substrate are facing each other, wherein atop portion of the convex shape of the first surface of the mold is defined by a center of the cavity formed in the second surface of the mold;
   a mold measurement unit configured to measure a position of the pattern region of the mold in a Z direction perpendicular to the substrate mounting surface; and
   a control unit configured to control a pressing force of the driving unit based on a distance in an XY plane parallel to the substrate mounting surface between the center of the pattern region in the mold and the top portion of the convex shape of the mold deformed by the deformation mechanism,
   wherein the driving unit includes three actuators,
   wherein the control unit is further configured to control the pressing force of the driving unit based on a reciprocal ratio of a distance in the XY plane between the three actuators of the driving unit and the top portion of the convex shape of the mold deformed by the deformation mechanism, and
   wherein the reciprocal ratio of the distance in the XY plane between the three actuators of the driving unit and the top portion of the convex shape of the mold deformed by the deformation mechanism is defined by the following equations:

$F1 = F \cdot (1/Lm1)/(1/Lm1 + 1/Lm2 + 1/Lm3),$ $F2 = F \cdot (1/Lm2)/(1/Lm1 + 1/Lm2 + 1/Lm3),$ $F3 = F \cdot (1/Lm3)/(1/Lm1 + 1/Lm2 + 1/Lm3),$ and $F = F1 + F2 + F3,$ where Lm1, Lm2, and Lm3 represent distances in the XY plane between the top portion of the convex shape of the mold and pressing positions of the three actuators,
   where F1, F2, and F3 represent pressing forces of the three actuators, and
   where F represents the pressing force of the driving unit.

2. The imprint apparatus according to claim 1, wherein the deformation mechanism is further configured to deform a surface of the substrate on a side facing the mold into a convex shape, and
   wherein the control unit is further configured to control the pressing force of the driving unit based on a distance in the XY plane between the driving unit and a top portion of the convex shape of the substrate held by the substrate holding unit and deformed by the deformation mechanism.

3. The imprint apparatus according to claim 1, wherein the driving unit includes a plurality of actuators disposed at different positions from each other, and
   wherein the control unit is further configured to control the pressing force of each of the plurality of actuators based on a corresponding reciprocal ratio of the distance in the XY plane between the top portion of the convex shape of the mold deformed by the deformation mechanism and each of the plurality of actuators.

4. The imprint apparatus according to claim 1, wherein the top portion of the convex shape of the mold is obtained based on positions in the Z direction measured by the mold measurement unit at a plurality of positions in a region where the pattern is formed on the surface of the mold deformed into the convex shape by the deformation mechanism.

5. The imprint apparatus according to claim 2, wherein the top portion of the convex shape of the substrate is obtained based on positions in the Z direction measured by a substrate measurement unit at a plurality of positions in a transfer region of the pattern on the surface of the substrate deformed into the convex shape by the deformation mechanism.

6. An article manufacturing method, comprising:
   forming a pattern on a substrate using an imprint apparatus that transfers a pattern of a mold to an imprint material on the substrate, the imprint apparatus comprising:
   the mold having a first surface including a pattern region in which the pattern is formed and a second surface, opposite the first surface, in which a cavity is formed;
   a substrate holding unit having a substrate mounting surface on which the substrate is mounted;
   a driving unit configured to drive the mold and press the mold against the substrate coated with the imprint material at three or more positions based on a center of the pattern region in the mold;
   a deformation mechanism configured to deform the first surface of the mold into a convex shape when the mold and the substrate are facing each other, wherein atop portion of the convex shape of the first surface of the mold is defined by a center of the cavity formed in the second surface of the mold;

a mold measurement unit configured to measure a position of the pattern region of the mold in a Z direction perpendicular to the substrate mounting surface; and a control unit configured to control a pressing force of the driving unit based on a distance in an XY plane parallel to the substrate mounting surface between the center of the pattern region in the mold and the top portion of the convex shape of the mold deformed by the deformation mechanism, wherein the driving unit includes three actuators, wherein the control unit is further configured to control the pressing force of the driving unit based on a reciprocal ratio of a distance in the XY plane between the three actuators of the driving unit and the top portion of the convex shape of the mold deformed by the deformation mechanism, and wherein the reciprocal ratio of the distance in the XY plane between the three actuators of the driving unit and the top portion of the convex shape of the mold deformed by the deformation mechanism is defined by the following equations:

$$F1 = F \cdot (1/Lm1)/(1/Lm1 + 1/Lm2 + 1/Lm3),$$

$$F2 = F \cdot (1/Lm2)/(1/Lm1 + 1/Lm2 + 1/Lm3),$$

$$F3 = F \cdot (1/Lm3)/(1/Lm1 + 1/Lm2 + 1/Lm3), \text{ and}$$

$$F = F1 + F2 + F3,$$

where $Lm1$, $Lm2$, and $Lm3$ represent distances in the XY plane between the top portion of the convex shape of the mold and pressing positions of the three actuators, where $F1$, $F2$, and $F3$ represent pressing forces of the three actuators, and where $F$ represents the pressing force of the driving unit.

\* \* \* \* \*